United States Patent
Yamazaki et al.

(10) Patent No.: US 11,222,764 B2
(45) Date of Patent: Jan. 11, 2022

(54) CHARGED PARTICLE BEAM DEVICE AND CONTROL METHOD OF OPTICAL SYSTEM OF CHARGED PARTICLE BEAM DEVICE

(71) Applicant: JEOL Ltd., Tokyo (JP)

(72) Inventors: Kazuya Yamazaki, Tokyo (JP); Yuko Shimizu, Tokyo (JP); Hirofumi Iijima, Tokyo (JP); Takuma Fukumura, Tokyo (JP); Naoki Hosogi, Tokyo (JP); Tomohiro Nakamichi, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/827,111

(22) Filed: Mar. 23, 2020

(65) Prior Publication Data
US 2020/0343072 A1 Oct. 29, 2020

(30) Foreign Application Priority Data
Apr. 25, 2019 (JP) .............................. JP2019-084296

(51) Int. Cl.
*H01J 37/10* (2006.01)
*H01J 37/147* (2006.01)
*H01J 37/26* (2006.01)

(52) U.S. Cl.
CPC ............ *H01J 37/10* (2013.01); *H01J 37/147* (2013.01); *H01J 37/26* (2013.01)

(58) Field of Classification Search
CPC .......... H01J 37/10; H01J 37/147; H01J 37/26; H01J 2237/2826; H01J 2237/1501; H01J 37/1471

(Continued)

(56) References Cited

U.S. PATENT DOCUMENTS 5,831,265 A * 11/1998 Shinkawa ............... H01J 37/28
  250/310
2013/0320210 A1* 12/2013 Yamada ................ H01J 37/28
  250/307

(Continued)

FOREIGN PATENT DOCUMENTS

| EP | 2672503 A2 | 11/2013 |
| JP | H3108239 A | 5/1991 |
| JP | 201710608 A | 1/2017 |

OTHER PUBLICATIONS

Extended European Search Report issued in EP20164280.8 dated Sep. 25, 2020.
Office Action issued in JP2019-084296 dated Dec. 15, 2020.

*Primary Examiner* — Michael Maskell
(74) *Attorney, Agent, or Firm* — The Webb Law Firm

(57) ABSTRACT

A charged particle beam device includes: a charged particle source; an optical system which acts on a charged particle beam emitted from the charged particle source; a control unit which controls the optical system; and a storage unit which stores previous setting values of the optical system. The optical system includes a first optical element and a second optical element for controlling a state of the charged particle beam to be incident on the first optical element. The control unit obtains an initial value of a setting value of the second optical element based on previous setting values of the second optical element; and changes a state of the charged particle beam by changing the setting value of the second optical element from the obtained initial value and obtains the setting value of the second optical element based on the change in the state of the charged particle beam.

11 Claims, 16 Drawing Sheets

(58) Field of Classification Search
USPC .................... 250/306, 307, 310, 311, 396 R
See application file for complete search history.

(56) References Cited

U.S. PATENT DOCUMENTS

2016/0217969 A1* 7/2016 Mizuhara ............ H01J 37/1471
2019/0115185 A1* 4/2019 Nakayama ............ B82Y 40/00

* cited by examiner

CHARGED PARTICLE BEAM DEVICE AND CONTROL METHOD OF OPTICAL SYSTEM OF CHARGED PARTICLE BEAM DEVICE

CROSS-REFERENCE TO RELATED APPLICATION

This application claims priority to Japanese Patent Application No. 2019-084296 filed Apr. 25, 2019, the disclosure of which is hereby incorporated by reference in its entirety.

BACKGROUND OF THE INVENTION

Field of the Invention

The present invention relates to a charged particle beam device and to a control method of an optical system of a charged particle beam device.

Description of Related Art

In charged particle beam devices such as a transmission electron microscope and a scanning electron microscope, adjustment of an optical system is performed prior to performing observation and analysis. For example, adjustment of a deflector which controls a position and an angle of an electron beam is performed so that the electron beam is incident along an optical axis of a probe-forming lens. In addition, for example, with a transmission electron microscope, adjustment of a lens that controls an illumination angle of an electron beam is performed so that the electron beam is incident in parallel to a specimen.

For example, JP-A-2017-10608 discloses, as a method of correcting a minute tilt angle of a charged particle beam, arranging a reflector between a charged particle source and an objective lens and performing tilt correction of the charged particle beam based on information related to a scanned image created by emitted charged particles which are emitted from a specimen and obtained by the reflector.

Such adjustments of an optical system are preferably performed accurately within a short period of time.

SUMMARY OF THE INVENTION

According to a first aspect of the invention, there is provided a charged particle beam device including:
a charged particle source;
an optical system which acts on a charged particle beam emitted from the charged particle source;
a control unit which controls the optical system; and
a storage unit which stores previous setting values of the optical system,
the optical system including:
a first optical element; and
a second optical element for controlling a state of the charged particle beam to be incident on the first optical element,
the control unit performing:
processing of obtaining an initial value of a setting value of the second optical element based on previous setting values of the second optical element which are stored in the storage unit; and
processing of changing a state of the charged particle beam by changing the setting value of the second optical element from the obtained initial value and obtaining the setting value of the second optical element based on the change in the state of the charged particle beam.

According to a second aspect of the invention, there is provided a control method of an optical system of a charged particle beam device which includes: a charged particle source; an optical system which acts on a charged particle beam emitted from the charged particle source; and a storage unit which stores previous setting values of the optical system, the optical system including a first optical element and a second optical element for controlling a state of the charged particle beam to be incident on the first optical element,
the control method including:
obtaining an initial value of a setting value of the second optical element based on previous setting values of the second optical element which are stored in the storage unit; and
changing a state of the charged particle beam by changing the setting value of the second optical element from the obtained initial value and obtaining the setting value of the second optical element based on the change in the state of the charged particle beam.

Figure 1:
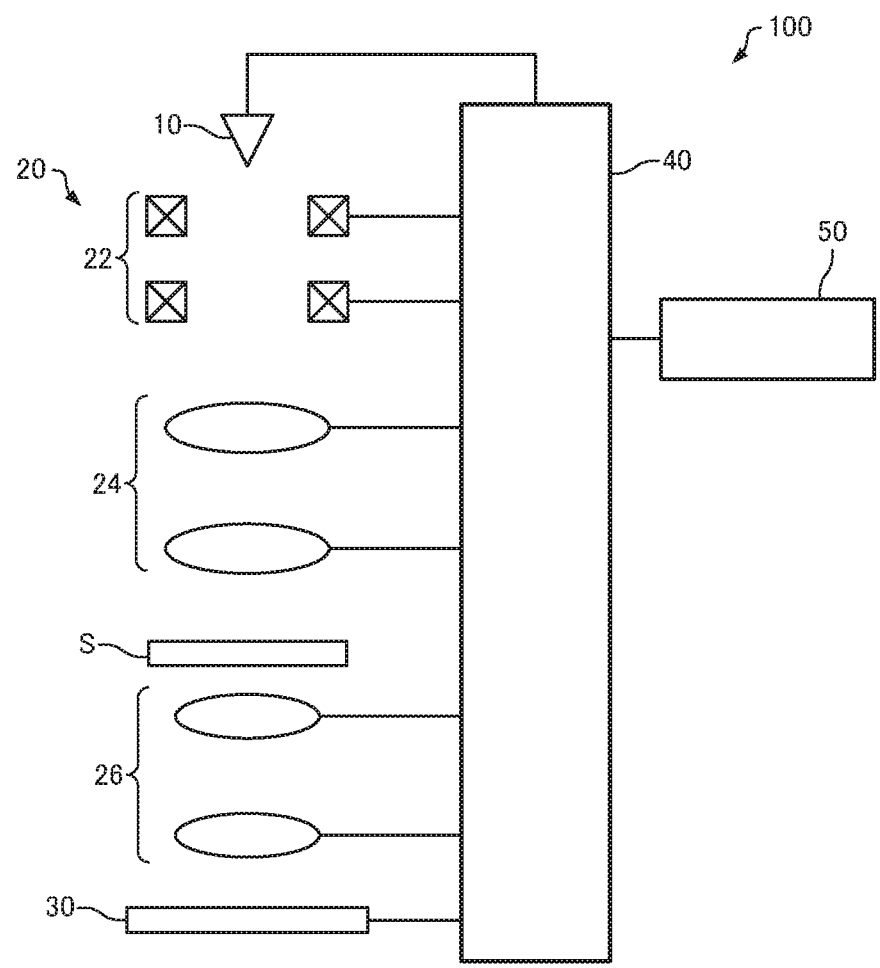
FIG. 1 is a diagram illustrating a configuration of an electron microscope according to a first embodiment.

DESCRIPTION OF THE INVENTION (1) According to an embodiment of the invention, there is provided a charged particle beam device including:
 a charged particle source;
 an optical system which acts on a charged particle beam emitted from the charged particle source;
 a control unit which controls the optical system; and
 a storage unit which stores previous setting values of the optical system,
 the optical system including:
 a first optical element; and
 a second optical element for controlling a state of the charged particle beam to be incident on the first optical element,
 the control unit performing:
 processing of obtaining an initial value of a setting value of the second optical element based on previous setting values of the second optical element which are stored in the storage unit; and
 processing of changing a state of the charged particle beam by changing the setting value of the second optical element from the obtained initial value and obtaining the setting value of the second optical element based on the change in the state of the charged particle beam.

With such a charged particle beam device, since the control unit obtains the initial value of the setting value of the second optical element based on previous setting values of the second optical element which are stored in the storage unit, an adjustment of the second optical element can be accurately performed in a short period of time.

(2) According to an embodiment of the invention, there is provided a control method of an optical system of a charged particle beam device which includes: a charged particle source; an optical system which acts on a charged particle beam emitted from the charged particle source; and a storage unit which stores previous setting values of the optical system, the optical system including a first optical element and a second optical element for controlling a state of the charged particle beam to be incident on the first optical element,
 the control method including:
 obtaining an initial value of a setting value of the second optical element based on previous setting values of the second optical element which are stored in the storage unit; and
 changing a state of the charged particle beam by changing the setting value of the second optical element from the obtained initial value and obtaining the setting value of the second optical element based on the change in the state of the charged particle beam.

With such a control method of an optical system of a charged particle beam device, since the initial value of the setting value of the second optical element is obtained based on previous setting values of the second optical element which are stored in the storage unit, an adjustment of the second optical element can be accurately performed in a short period of time.

Preferred embodiments of the invention are described in detail below with reference to the drawings. Note that the following embodiments do not unduly limit the scope of the invention as stated in the claims. In addition, all of the elements described below are not necessarily essential requirements of the invention.

Furthermore, while the charged particle beam device according to the invention will be described below using an electron microscope that performs an observation and an analysis of a specimen by illuminating the specimen with an electron beam as an example, the charged particle beam device according to the invention may be an apparatus that performs an observation and an analysis of a specimen by irradiating a charged particle beam (such as an ion beam) other than an electron beam. Examples of such a charged particle beam device include a transmission electron microscope, a scanning transmission electron microscope, a scanning electron microscope, and a focused ion-beam device.

1. First Embodiment

1.1. Configuration of Electron Microscope

First, an electron microscope according to a first embodiment will be described with reference to the drawings. FIG. 1 is a diagram illustrating a configuration of an electron microscope 100 according to the first embodiment.

As illustrated in FIG. 1, the electron microscope 100 includes an electron source 10 which is an example of the charged particle source, an optical system 20, a detector 30, a control unit 40, and a storage unit 50.

The electron source 10 generates electron beams. The electron source 10 is, for example, an electron gun which accelerates electrons emitted from a cathode by an anode and which emits the accelerated electrons as an electron beam.

The optical system 20 acts on an electron beam emitted from the electron source 10. The optical system 20 includes a multi-stage deflector 22, an illumination lens system 24, and an imaging lens system 26. It should be noted that the illumination lens system 24 is an example of the first optical element and the multi-stage deflector 22 is an example of the second optical element.

The multi-stage deflector 22 causes an electron beam emitted from the electron source 10 to be deflected two-dimensionally. In the illustrated example, the multi-stage deflector 22 is constituted by two deflection coils arranged along an optical axis. It should be noted that, alternatively, the multi-stage deflector 22 may be constituted by three or more deflection coils arranged along the optical axis.

The multi-stage deflector 22 is used in order to control a state of an electron beam to be incident on the illumination lens system 24. Specifically, the multi-stage deflector 22 is used in order to control an incidence position of an electron beam with respect to the illumination lens system 24 and an incidence angle of the electron beam with respect to an optical axis of the illumination lens system 24.

The illumination lens system 24 causes the electron beam emitted from the electron source 10 to converge and illuminates a specimen S with the converged electron beam. The illumination lens system 24 is a multi-stage lens system. In the illustrated example, the illumination lens system 24 is constituted by two illumination lenses arranged along an optical axis. In other words, the illumination lens system 24 is a two-stage lens system. It should be noted that, alternatively, the illumination lens system 24 may be constituted by three or more illumination lenses arranged along the optical axis.

Although not illustrated, the electron microscope 100 is equipped with a specimen stage for holding the specimen S. The specimen S can be positioned by the specimen stage.

The imaging lens system 26 forms a transmission electron microscope image (a TEM image) with electrons having been transmitted through the specimen S. The detector 30 photographs a TEM image formed by the imaging lens system 26. For example, the detector 30 is a digital camera such as a charge coupled device (CCD) camera. The TEM image photographed by the detector 30 is sent to the control unit 40 and stored in the storage unit 50.

The control unit 40 controls the electron source 10, the optical system 20, and the detector 30. As will be described later, the control unit 40 performs: processing of obtaining an initial value of a setting value of the multi-stage deflector 22; and processing of changing a state of an electron beam by changing a setting value of the multi-stage deflector 22 from the initial value and obtaining a setting value of the multi-stage deflector 22 based on the change in the state of the electron beam. In the first embodiment, the state of the electron beam refers to an incidence position of the electron beam with respect to the illumination lens system 24. In other words, the control unit 40 performs processing of controlling the incidence position of the electron beam with respect to the illumination lens system 24. Details of the processing performed by the control unit 40 will be described later.

Functions of the control unit 40 can be realized by, for example, having various processors (a central processing unit (CPU) and the like) execute programs. Alternatively, at least a part of the functions of the control unit 40 may be realized by a dedicated circuit.

The storage unit 50 serves as a work area for the control unit 40, and functions thereof can be realized by a random access memory (RAM), a read only memory (ROM), a hard disk, or the like. The storage unit 50 stores programs, data, and the like that enable the control unit 40 to perform various control processes and calculation processes. In addition, the storage unit 50 is also used to temporarily store results of calculations and the like performed by the control unit 40 according to various programs. The storage unit 50 stores previous setting values of the optical system 20.

1.2. Control Method of Optical System

Next, a control method of the optical system of the electron microscope 100 according to the first embodiment will be described.

1.2.1. Optimization Processing of Incidence Position

In the electron microscope 100, the optical system 20 is controlled by the control unit 40. Hereinafter, processing will be described in which the control unit 40 controls the multi-stage deflector 22 so that an incidence position of an electron beam with respect to the illumination lens system 24 assumes an optimal position. Hereinafter, this processing will also be referred to as optimization processing of an incidence position.

When an electron beam is incident on a center of the illumination lens system 24 along an optical axis, a position of the electron beam having passed through the illumination lens system 24 does not change even if a setting value of the illumination lens system 24 is changed. Therefore, an optimal incidence position is an incidence position where a change in a position of an electron beam having passed through the illumination lens system 24 is minimized even if the setting value of the illumination lens system 24 is changed.

Figure 2:
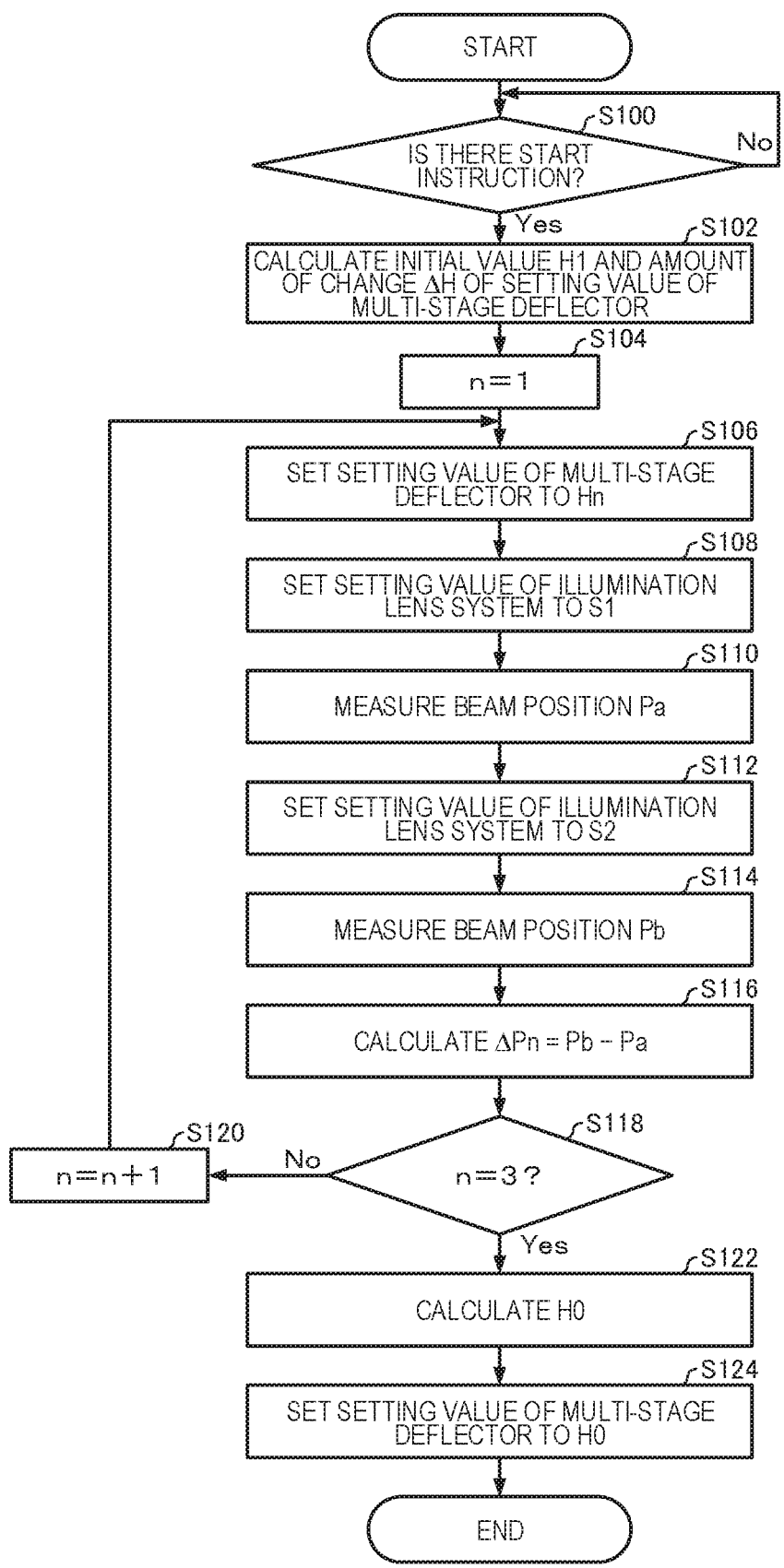
FIG. 2 is a flow chart illustrating an example of optimization processing of an incidence position.
Figure 3:
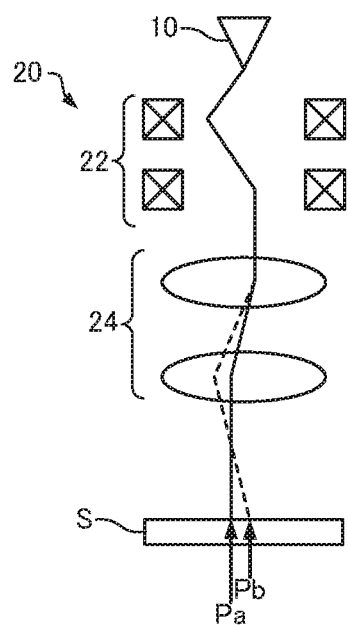
FIG. 3 is a diagram for explaining an operation of an optical system during optimization processing of an incidence position.
Figure 4:
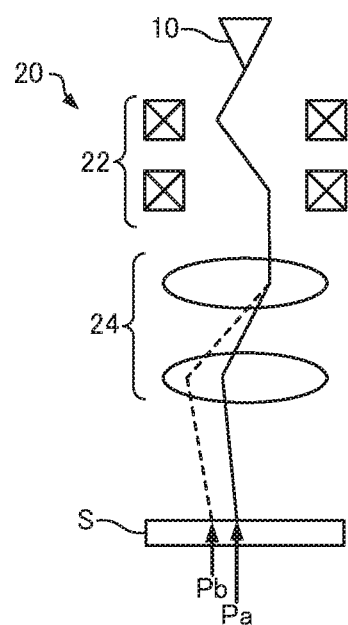
FIG. 4 is a diagram for explaining an operation of an optical system during optimization processing of an incidence position.
Figure 5:
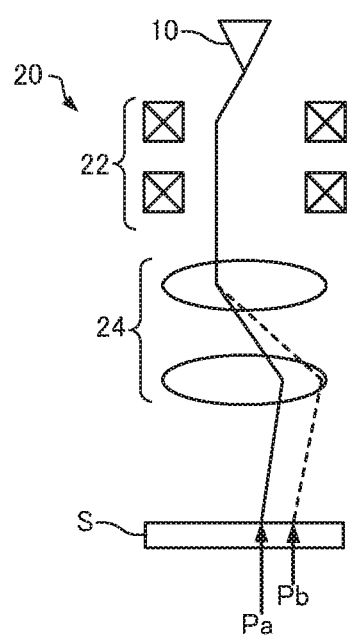
FIG. 5 is a diagram for explaining an operation of an optical system during optimization processing of an incidence position.

FIG. 2 is a flow chart illustrating an example of the optimization processing of an incidence position. FIGS. 3 to 5 are diagrams for explaining an operation of the optical system 20 during the optimization processing of an incidence position. It should be noted that, in FIGS. 3 to 5, only the electron source 10, the multi-stage deflector 22, the illumination lens system 24, and the specimen S are illustrated for the sake of brevity.

The control unit 40 determines whether or not a user has issued an instruction (a start instruction) to start the optimization processing of an incidence position (S100). For example, the control unit 40 determines that the user has issued a start instruction when a press operation of a start button for issuing an instruction to start the optimization processing of an incidence position is performed or when a start instruction is input from an input device or the like.

When it is determined that the start instruction has been issued (Yes in S100), the control unit 40 calculates an initial value H1 of a setting value Hn of the multi-stage deflector 22 and an amount of change ΔH of the setting value Hn of the multi-stage deflector 22 (S102). The setting value Hn of the multi-stage deflector 22 is a value that controls the incidence position of an electron beam with respect to the illumination lens system 24. A calculation method of the initial value H1 and the amount of change ΔH will be described later.

Next, the control unit 40 sets the setting value of the multi-stage deflector 22 to the initial value H1 and obtains a first amount of change ΔP1 which is an amount of change of the position of the electron beam having passed through the illumination lens system 24 when the setting value of the illumination lens system 24 is changed (S106 to S116).

Specifically, first, assuming that n=1 is true (S104), the control unit 40 sets the setting value of the multi-stage deflector 22 to the initial value H1 (S106). As the initial value H1, the value calculated in the processing of step S102 is used.

Next, the control unit 40 sets the setting value of the illumination lens system 24 to a setting value S1 (S108). The setting value S1 is, for example, a value that maximizes a beam diameter of the electron beam on the specimen S. In a state where the setting value of the multi-stage deflector 22 is set to the initial value H1 and the setting value of the illumination lens system 24 is set to the setting value S1, the control unit 40 measures a position Pa of the electron beam on the specimen S as illustrated in FIG. 3 (S110). For example, the control unit 40 acquires a TEM image photographed by the detector 30 and measures the position Pa from the acquired TEM image.

Next, the control unit 40 sets the setting value of the illumination lens system 24 to a setting value S2 (S112). The setting value S2 is expressed as S2=S1+ΔS. The setting value S2 is, for example, a value that minimizes the beam diameter of the electron beam on the specimen S. In a state where the setting value of the multi-stage deflector 22 is set to the initial value H1 and the setting value of the illumination lens system 24 is set to the setting value S2, the control unit 40 measures a position Pb of the electron beam on the specimen S as illustrated in FIG. 3 (S114). For example, the control unit 40 acquires a TEM image photographed by the detector 30 and measures the position Pb from the acquired TEM image.

Next, the control unit 40 calculates the first amount of change $\Delta P1=Pb-Pa$ (S116). According to the steps described above, the first amount of change $\Delta P1$ can be obtained.

Next, the control unit 40 determines whether or not n=3 is true (S118), and when it is determined that n=3 is false (No in S118), the control unit 40 assumes that n=n+1 is true (S120) and returns to step S106. Subsequently, the control unit 40 sets the setting value of the multi-stage deflector 22 to a setting value H2 which represents a change by the amount of change $\Delta H$ from the initial value H1 and obtains a second amount of change $\Delta P2$ which is an amount of change of the position of the electron beam having passed through the illumination lens system 24 when the setting value of the illumination lens system 24 is changed (S106 to S116).

Specifically, first, the control unit 40 sets the setting value of the multi-stage deflector 22 to the setting value H2 (S106). The setting value H2 is a value as a result of changing the initial value H1 by the amount of change $\Delta H$ obtained in step S102. For example, $H2=H1+\Delta H$. By having the control unit 40 change the setting value of the multi-stage deflector 22 from the setting value H1 to the setting value H2, the incidence position of the electron beam with respect to the illumination lens system 24 changes.

Next, the control unit 40 sets the setting value of the illumination lens system 24 to the setting value S1 (S108). In a state where the setting value of the multi-stage deflector 22 is set to the setting value H2 and the setting value of the illumination lens system 24 is set to the setting value S1, the control unit 40 measures the position Pa of the electron beam on the specimen S as illustrated in FIG. 4 (S110).

Next, the control unit 40 sets the setting value of the illumination lens system 24 to the setting value S2 (S112). In a state where the setting value of the multi-stage deflector 22 is set to the setting value H2 and the setting value of the illumination lens system 24 is set to the setting value S2, the control unit 40 measures the position Pb of the electron beam on the specimen S as illustrated in FIG. 4 (S114).

Next, the control unit 40 calculates the second amount of change $\Delta P2=Pb-Pa$ (S116). According to the steps described above, the second amount of change $\Delta P2$ can be obtained.

Next, the control unit 40 determines whether or not n=3 is true (S118), and when it is determined that n=3 is false (No in S118), the control unit 40 assumes that n=n+1 is true (S120) and returns to step S106. Subsequently, the control unit 40 sets the setting value of the multi-stage deflector 22 to a setting value H3 which represents a change by the amount of change $\Delta H$ from the initial value H1 and obtains a third amount of change $\Delta P3$ which is an amount of change of the position of the electron beam having passed through the illumination lens system 24 when the setting value of the illumination lens system 24 is changed (S106 to S116).

Specifically, first, the control unit 40 sets the setting value of the multi-stage deflector 22 to the setting value H3 (S106). The setting value H3 is a value as a result of changing the initial value H1 by the amount of change $\Delta H$ obtained in step S102. For example, $H3=H1-\Delta H$. By having the control unit 40 change the setting value of the multi-stage deflector 22 from the setting value H2 to the setting value H3, the incidence position of the electron beam with respect to the illumination lens system 24 changes.

Next, the control unit 40 sets the setting value of the illumination lens system 24 to the setting value S1 (S108). In a state where the setting value of the multi-stage deflector 22 is set to the setting value H3 and the setting value of the illumination lens system 24 is set to the setting value S1, the control unit 40 measures the position Pa of the electron beam on the specimen S as illustrated in FIG. 5 (S110).

Next, the control unit 40 sets the setting value of the illumination lens system 24 to the setting value S2 (S112). In a state where the setting value of the multi-stage deflector 22 is set to the setting value H3 and the setting value of the illumination lens system 24 is set to the setting value S2, the control unit 40 measures the position Pb of the electron beam on the specimen S as illustrated in FIG. 5 (S114).

Next, the control unit 40 calculates the third amount of change $\Delta P3=Pb-Pa$ (S116). According to the steps described above, the third amount of change $\Delta P3$ can be obtained.

The control unit 40 determines whether or not n=3 is true (S118), and when it is determined that n=3 is true (Yes in S118), the control unit 40 obtains a setting value H0 of the multi-stage deflector 22 at which an amount of change of the position of the electron beam having passed through the illumination lens system 24 becomes zero when the setting value of the illumination lens system 24 is changed based on the first amount of change $\Delta P1$, the second amount of change $\Delta P2$, and the third amount of change $\Delta P3$ (S122). A calculation method of the setting value H0 will be described later.

The control unit 40 sets the setting value of the multi-stage deflector 22 to the setting value H0 obtained in step S122 (S124). Subsequently, the control unit 40 ends the processing.

1.2.2. Calculation of Initial Value H1 and Amount of Change ΔH

Next, a calculation method of the initial value H1 and the amount of change $\Delta H$ in step S102 will be described.

Figure 6:
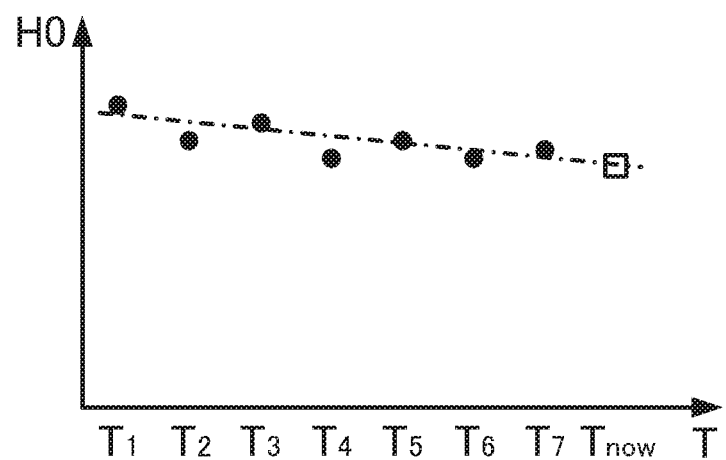
FIG. 6 is a diagram for explaining a calculation method of an initial value H1 and an amount of change ΔH.

The control unit 40 obtains the initial value H1 and the amount of change $\Delta H$ based on previous setting values of the multi-stage deflector 22 which are stored in the storage unit 50. FIG. 6 is a diagram for explaining the calculation method of the initial value H1 and the amount of change $\Delta H$. An abscissa of a graph in FIG. 6 represents a time point T and an ordinate of the graph represents the setting value H0 of the multi-stage deflector 22.

The control unit 40 causes the storage unit 50 to store a setting value of the multi-stage deflector 22 at set time intervals. In addition, the control unit 40 causes the storage unit 50 to store, together with the setting value, a time point at which the setting value had been stored. In the example in FIG. 6, the setting value H0 of the multi-stage deflector 22 is stored in the storage unit 50 at a time interval $\Delta T$. Specifically, the setting values H0 at a time point $T_1$, a time point $T_2$, a time point $T_3$, a time point $T_4$, a time point $T_5$, a time point $T_6$, and a time point $T_7$ are stored in the storage unit 50. The time interval $\Delta T$ can be arbitrarily set. For example, the time interval $\Delta T$ may be 24 hours or 168 hours.

For example, the control unit 40 reads the setting values H0 stored in the storage unit 50, calculates a time average HT of the setting values H0, and adopts the calculated time average HT as the initial value H1. In other words, H1=HT. In this manner, the setting value H0 at a present time point Tnow is estimated from previous setting values H0 to determine the initial value H1. In addition, for example, the control unit 40 calculates a standard deviation σ of the setting values H0 and adopts the calculated standard deviation σ as the amount of change ΔH. In other words, ΔH=σ. In this manner, a variation in the setting value H0 is estimated from a variation in previous setting values H0 to determine the amount of change ΔH.

While a case where the control unit 40 causes the storage unit 50 to store the time point T and the setting value H0 at the time point T at a time interval ΔT has been explained in the example described above, a timing at which the storage unit 50 is caused to store the time point T and the setting value H0 is not limited thereto.

Figure 7:
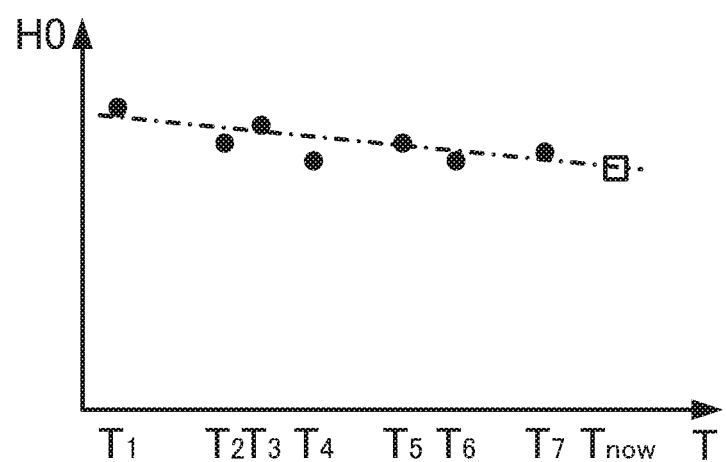
FIG. 7 is a diagram for explaining a calculation method of the initial value H1 and the amount of change ΔH.

For example, as illustrated in FIG. 7, the control unit 40 need not cause the storage unit 50 to store the time point T and the setting value H0 at constant time intervals. For example, after the optimization processing of an incidence position illustrated in FIG. 2 is finished, the control unit 40 may cause the storage unit 50 to store the setting value H0 obtained in the processing. In other words, the control unit 40 causes the storage unit 50 to store the setting value H0 at a timing where the optimization processing of an incidence position is finished. For example, the control unit 40 causes the storage unit 50 to store the setting value H0 as soon as the optimization processing of an incidence position is finished.

Alternatively, the control unit 40 may cause the storage unit 50 to store the time point T and the setting value H0 at the time interval ΔT and, after the optimization processing of an incidence position is finished, the control unit 40 may cause the storage unit 50 to store the time point T and the setting value H0 obtained in the processing.

1.2.3. Calculation Method of Setting Value H0

Next, a calculation method of the setting value H0 in step S122 will be described.

Figure 8:
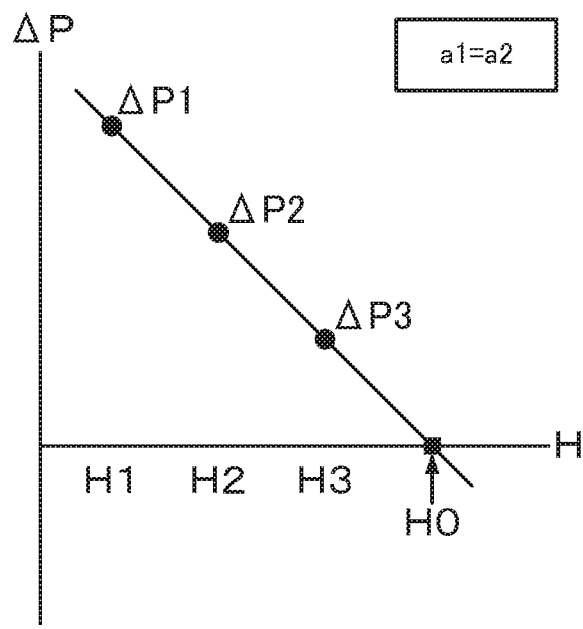
FIG. 8 is a diagram for explaining a calculation method of a setting value H0.
Figure 9:
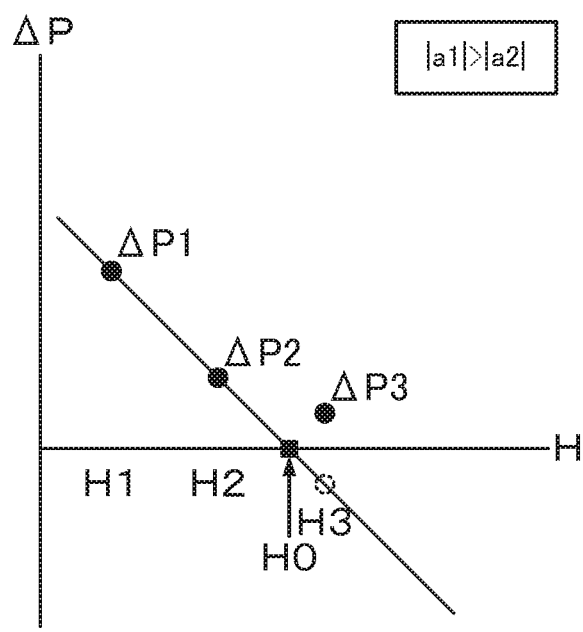
FIG. 9 is a diagram for explaining a calculation method of the setting value H0.
Figure 10:
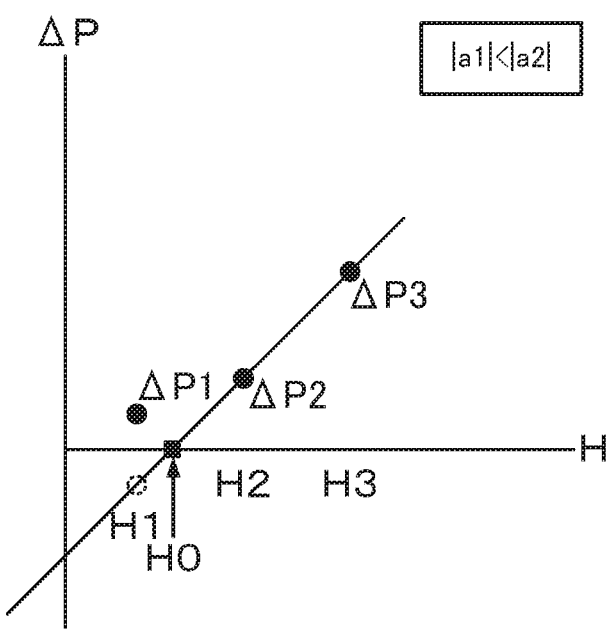
FIG. 10 is a diagram for explaining a calculation method of the setting value H0.

FIGS. 8 to 10 are diagrams for explaining a calculation method of the setting value H0.

The setting value H1, the setting value H2, and the setting value H3 and the first amount of change ΔP1, the second amount of change ΔP2, and the third amount of change ΔP3 are in a linear relationship. Therefore, a relational expression is obtained from these values to obtain the setting value H0 of the multi-stage deflector 22 at which an amount of change ΔP of the position of the electron beam having passed through the illumination lens system 24 becomes zero when the setting value of the illumination lens system 24 is changed.

For example, first, a1, a2, b1, and b2 expressed by the following equations are obtained.

$$a1=(\Delta P2-\Delta P1)/(H2-H1)$$

$$a2=(\Delta P3-\Delta P2)/(H3-H2)$$

$$b1=(H2 \times \Delta P1 - H1 \times \Delta P2)/(H2-H1)$$

$$b2=(H3 \times \Delta P2 - H2 \times \Delta P3)/(H3-H2)$$

In this case, as illustrated in FIG. 8, when a1=a2, the setting value H0 is obtained by the following equation.

$$H0=|b1/a1|$$

In addition, as illustrated in FIG. 9, when |a1|>|a2|, the setting value H0 is obtained by the following equation.

$$H0=|b1/a1|$$

In addition, as illustrated in FIG. 10, when |a11|<|a2|, the setting value H0 is obtained by the following equation.

$$H0=|b2/a2|$$

It should be noted that the calculation method of the setting value H0 is not limited to the example described above.

For example, while the setting value of the multi-stage deflector 22 is changed such that H1, H2=H1+ΔH, and H3=H1−ΔH in the example described above, the setting value of the multi-stage deflector 22 may be changed such that H1, H2=H1+ΔH, and H3=H1+2×ΔH. Alternatively, for example, the setting value of the multi-stage deflector 22 may be changed such that H1, H2=H1−ΔH, and H3=H1−2×ΔH.

In addition, while the setting value H0 is obtained by obtaining a relational expression from the three points of the first amount of change ΔP1, the second amount of change ΔP2, and the third amount of change ΔP3 in the example described above, for example, the setting value H0 may be obtained by obtaining a relational expression from two points or the setting value H0 may be obtained by obtaining a relational expression from four or more points.

1.3. Effects

For example, the electron microscope 100 has the following effects.

In the electron microscope 100, the control unit 40 performs: processing of obtaining the initial value H1 of a setting value of the multi-stage deflector 22; and processing of changing a state of an electron beam by changing a setting value of the multi-stage deflector 22 from the initial value H1 and obtaining a setting value of the multi-stage deflector 22 based on the change in the state of the electron beam. In addition, in the processing of obtaining the initial value H1 of the setting value of the multi-stage deflector 22, the control unit 40 obtains the initial value H1 based on previous setting values of the multi-stage deflector 22 which are stored in the storage unit 50.

In this manner, since the control unit 40 obtains the initial value H1 in optimization processing of an incidence position based on previous setting values of the multi-stage deflector 22, a setting value estimated from previous setting values can be adopted as the initial value H1. Therefore, with the electron microscope 100, an adjustment of the multi-stage deflector 22 can be accurately performed in a short period of time. Furthermore, in the electron microscope 100, since the control unit 40 performs the optimization processing of an incidence position, an observation and an analysis can be performed at an optimal incidence position of an electron beam without the user having to perform an adjustment. In addition, for example, when the user manually performs an adjustment of the multi-stage deflector 22, a variation may occur among settings due to the user's skill. By comparison, in the electron microscope 100, a variation among settings due to the user's skill does not occur.

In the electron microscope 100, the initial value H1 is a time average of previous setting values of the multi-stage deflector 22 which are stored in the storage unit 50. Therefore, with the electron microscope 100, an adjustment of the multi-stage deflector 22 can be accurately performed in a short period of time.

In the electron microscope 100, the control unit 40 performs processing of obtaining the amount of change ΔH from the initial value H1, and in the processing of obtaining a setting value of the multi-stage deflector 22, the setting value of the multi-stage deflector 22 is changed from the initial value H1 by the obtained amount of change ΔH. In addition, in the processing of obtaining the amount of change ΔH, the control unit 40 obtains the amount of change ΔH based on previous setting values of the multi-stage deflector 22 which are stored in the storage unit 50. Furthermore, the amount of change ΔH is a standard deviation of previous setting values of the multi-stage deflector 22 which are stored in the storage unit 50. As a result, the amount of change ΔH can be obtained from a variation in the setting value as predicted from the variation in previous setting values. Therefore, with the electron microscope 100, an adjustment of the multi-stage deflector 22 can be accurately performed in a short period of time.

In the electron microscope 100, the control unit 40 causes the storage unit 50 to store a setting value of the multi-stage deflector 22 at set time intervals. As a result, a change over time of the setting value of the multi-stage deflector 22 can be stored. Therefore, with the electron microscope 100, an adjustment of the multi-stage deflector 22 can be accurately performed in a short period of time.

In the electron microscope 100, after the control unit 40 performs the processing of obtaining the setting value of the multi-stage deflector 22, the control unit 40 causes the storage unit 50 to store the obtained setting value of the multi-stage deflector 22. Therefore, the storage unit 50 can be caused to store a change over time of the setting value of the multi-stage deflector 22. In addition, the storage unit 50 can be caused to store a setting value in a state where an incidence position of an electron beam has been further optimized.

2. Second Embodiment

2.1. Electron Microscope

Next, an electron microscope according to a second embodiment will be described. A configuration of the electron microscope according to the second embodiment is the same as the configuration of the electron microscope 100 according to the first embodiment illustrated in FIG. 1 and, therefore, a description thereof will be omitted.

2.2. Control Method of Optical System

Next, a control method of an optical system of the electron microscope according to the second embodiment will be described. The following description will focus on points that differ from the example of the control method of the optical system of the electron microscope according to the first embodiment described above, and a description of similar points will be omitted.

2.2.1. Optimization Process of Incidence Angle

In the first embodiment described above, processing has been described in which a setting value of the multi-stage deflector 22 is a value that controls an incidence position of an electron beam with respect to the illumination lens system 24 and the control unit 40 controls the multi-stage deflector 22 so that the incidence position of the electron beam with respect to the illumination lens system 24 assumes an optimal position.

In contrast, in the second embodiment, a setting value of the multi-stage deflector 22 is a value that controls an incidence angle of an electron beam with respect to an optical axis of the illumination lens system 24 and the control unit 40 performs processing of controlling the multi-stage deflector 22 so that the incidence angle of the electron beam with respect to the illumination lens system 24 assumes an optimal incidence angle. Hereinafter, this processing will also be referred to as optimization processing of an incidence angle.

In this case, an optimal incidence angle is an incidence angle where a change in a position of an electron beam having passed through the illumination lens system 24 is minimized even if the setting value of the illumination lens system 24 is changed.

Figure 11:
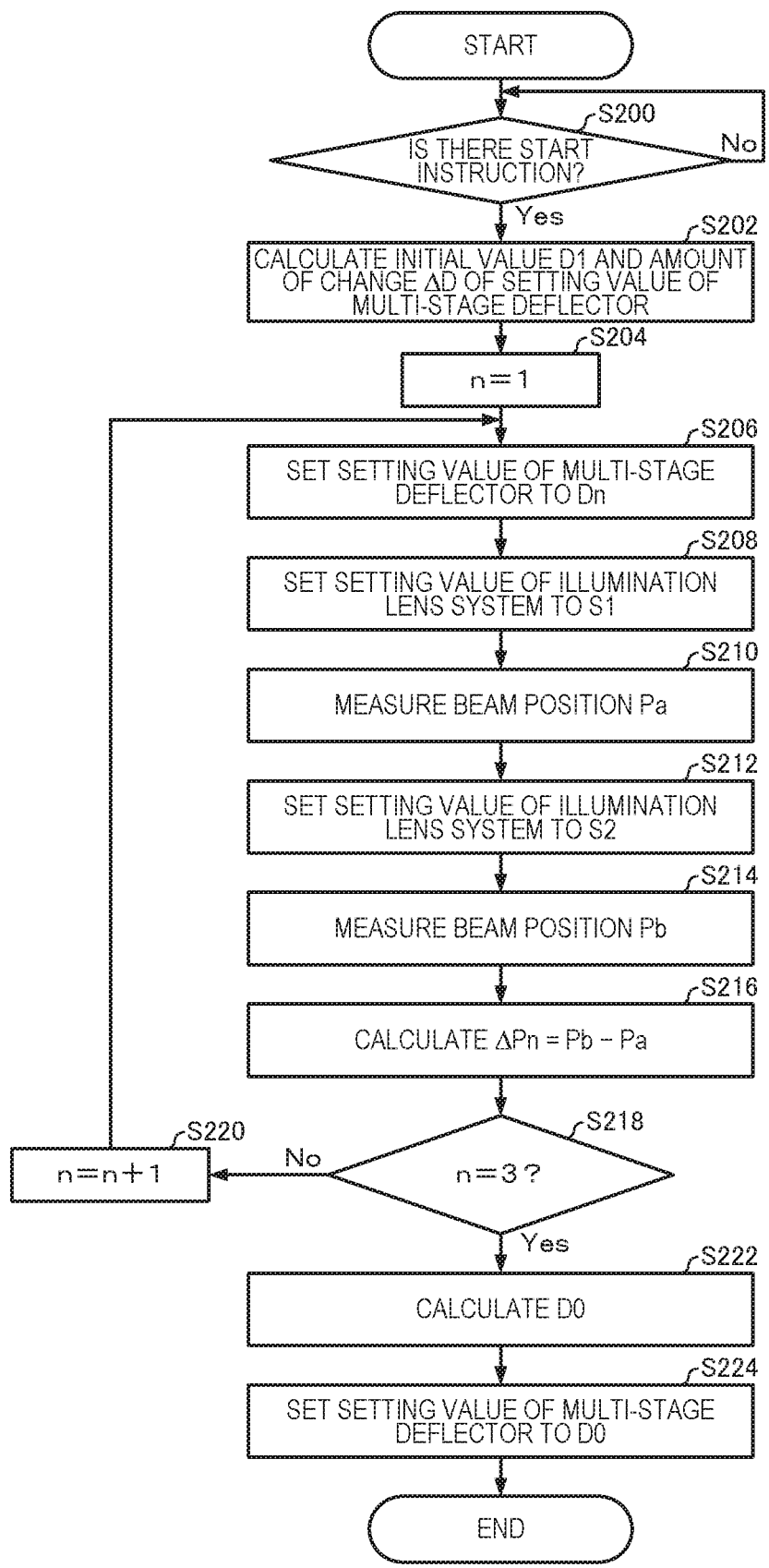
FIG. 11 is a flow chart illustrating an example of optimization processing of an incidence angle.
Figure 12:
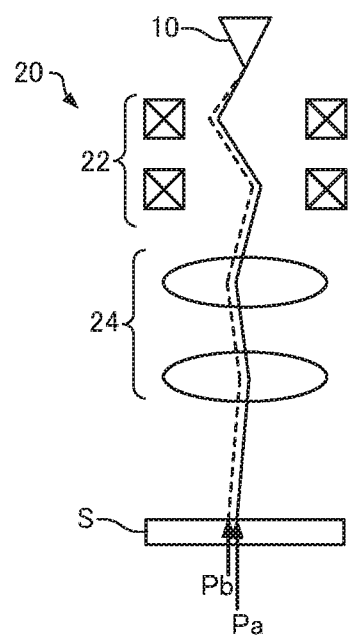
FIG. 12 is a diagram for explaining an operation of an optical system during optimization processing of an incidence angle.
Figure 13:
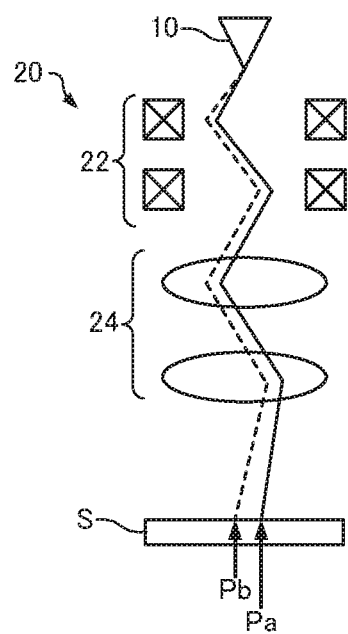
FIG. 13 is a diagram for explaining an operation of an optical system during optimization processing of an incidence angle.
Figure 14:
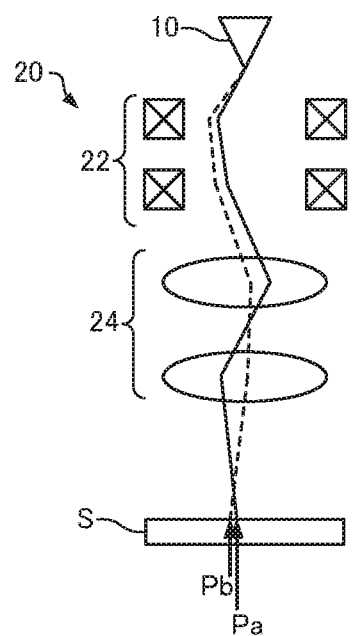
FIG. 14 is a diagram for explaining an operation of an optical system during optimization processing of an incidence angle.

FIG. 11 is a flow chart illustrating an example of the optimization processing of an incidence angle. FIGS. 12 to 14 are diagrams for explaining an operation of the optical system 20 during the optimization processing of an incidence angle. It should be noted that, in FIGS. 12 to 14, only the electron source 10, the multi-stage deflector 22, the illumination lens system 24, and the specimen S are illustrated for the sake of brevity.

The control unit 40 determines whether or not the user has issued an instruction to start optimization processing of an incidence angle (S200).

When it is determined that a start instruction has been issued (Yes in S200), the control unit 40 calculates an initial value D1 of a setting value Dn of the multi-stage deflector 22 and an amount of change ΔD of the setting value Dn of the multi-stage deflector 22 (S202). The setting value Dn of the multi-stage deflector 22 is a value that controls the incidence angle of the electron beam with respect to an optical axis of the illumination lens system 24. A calculation method of the initial value D1 and the amount of change ΔD will be described later.

Next, the control unit 40 sets the setting value of the multi-stage deflector 22 to the initial value D1 and obtains the first amount of change ΔP1 which is an amount of change of the position of the electron beam having passed through the illumination lens system 24 when the setting value of the illumination lens system 24 is changed (S206 to S216).

Specifically, first, assuming that n=1 is true (S204), the control unit 40 sets the setting value of the multi-stage deflector 22 to the initial value D1 (S206). As the initial value D1, the value calculated in the processing of step S202 is used.

Next, the control unit 40 sets the setting value of the illumination lens system 24 to the setting value S1 (S208). In a state where the setting value of the multi-stage deflector 22 is set to the initial value D1 and the setting value of the illumination lens system 24 is set to the setting value S1, the control unit 40 measures the position Pa of the electron beam on the specimen S as illustrated in FIG. 12 (S210).

Next, the control unit 40 sets the setting value of the illumination lens system 24 to the setting value S2 (S212). In a state where the setting value of the multi-stage deflector 22 is set to the initial value D1 and the setting value of the illumination lens system 24 is set to the setting value S2, the control unit 40 measures the position Pb of the electron beam on the specimen S as illustrated in FIG. 12 (S214).

Next, the control unit 40 calculates the first amount of change ΔP1=Pb−Pa (S216). According to the steps described above, the first amount of change ΔP1 can be obtained.

Next, the control unit 40 determines whether or not n=3 is true (S218), and when it is determined that n=3 is false (No in S218), the control unit 40 assumes that n=n+1 is true (S220) and returns to step S206. Subsequently, the control unit 40 sets the setting value of the multi-stage deflector 22 to the setting value D2 which represents a change by the amount of change ΔD from the initial value D1 and obtains the second amount of change ΔP2 which is an amount of change of the position of the electron beam having passed through the illumination lens system 24 when the setting value of the illumination lens system 24 is changed (S206 to S216).

Specifically, first, the control unit 40 sets the setting value of the multi-stage deflector 22 to the setting value D2 (S206). The setting value D2 is a value as a result of changing the initial value D1 by the amount of change ΔD obtained in step S202. For example, D2=D1+ΔD. By having the control unit 40 change the setting value of the multi-stage deflector 22 from the setting value D1 to the setting value D2, the incidence angle of the electron beam with respect to the optical axis of the illumination lens system 24 changes.

Next, the control unit 40 sets the setting value of the illumination lens system 24 to the setting value S1 (S208). In a state where the setting value of the multi-stage deflector 22 is set to the setting value D2 and the setting value of the illumination lens system 24 is set to the setting value S1, the control unit 40 measures the position Pa of the electron beam on the specimen S as illustrated in FIG. 13 (S210).

Next, the control unit 40 sets the setting value of the illumination lens system 24 to the setting value S2 (S212). In a state where the setting value of the multi-stage deflector 22 is set to the setting value D2 and the setting value of the illumination lens system 24 is set to the setting value S2, the control unit 40 measures the position Pb of the electron beam on the specimen S as illustrated in FIG. 13 (S214).

Next, the control unit 40 calculates the second amount of change ΔP2=Pb−Pa (S216). According to the steps described above, the second amount of change ΔP2 can be obtained.

Next, the control unit 40 determines whether or not n=3 is true (S218), and when it is determined that n=3 is false (No in S218), the control unit 40 assumes that n=n+1 is true (S220) and returns to step S206. Subsequently, the control unit 40 sets the setting value of the multi-stage deflector 22 to a setting value D3 which represents a change by the amount of change ΔD from the initial value D1 and obtains the third amount of change ΔP3 which is an amount of change of the position of the electron beam having passed through the illumination lens system 24 when the setting value of the illumination lens system 24 is changed (S206 to S216).

Specifically, first, the control unit 40 sets the setting value of the multi-stage deflector 22 to the setting value D3 (S206). The setting value D3 is a value as a result of changing the initial value D1 by the amount of change ΔD obtained in step S202. For example, D3=D1+ΔD. By having the control unit 40 change the setting value of the multi-stage deflector 22 from the setting value H2 to the setting value H3, the incidence position of the electron beam with respect to the illumination lens system 24 changes.

Next, the control unit 40 sets the setting value of the illumination lens system 24 to the setting value S1 (S208). In a state where the setting value of the multi-stage deflector 22 is set to the setting value D3 and the setting value of the illumination lens system 24 is set to the setting value S1, the control unit 40 measures the position Pa of the electron beam on the specimen S as illustrated in FIG. 14 (S210).

Next, the control unit 40 sets the setting value of the illumination lens system 24 to the setting value S2 (S212). In a state where the setting value of the multi-stage deflector 22 is set to the setting value D3 and the setting value of the illumination lens system 24 is set to the setting value S2, the control unit 40 measures the position Pb of the electron beam on the specimen S as illustrated in FIG. 14 (S214).

Next, the control unit 40 calculates the third amount of change ΔP3=Pb−Pa (S216). According to the steps described above, the third amount of change ΔP3 can be obtained.

The control unit 40 determines whether or not n=3 is true (S218), and when it is determined that n=3 is true (Yes in S218), the control unit 40 obtains a setting value D0 of the multi-stage deflector 22 at which an amount of change of the position of the electron beam having passed through the illumination lens system 24 becomes zero when the setting value of the illumination lens system 24 is changed based on the first amount of change ΔP1, the second amount of change ΔP2, and the third amount of change ΔP3 (S222). A calculation method of the setting value D0 will be described later.

The control unit 40 sets the setting value of the multi-stage deflector 22 to the setting value D0 determined in step S222 (S224). Subsequently, the control unit 40 ends the processing.

2.2.2. Calculation of Initial Value D1 and Amount of Change ΔD

Figure 15:
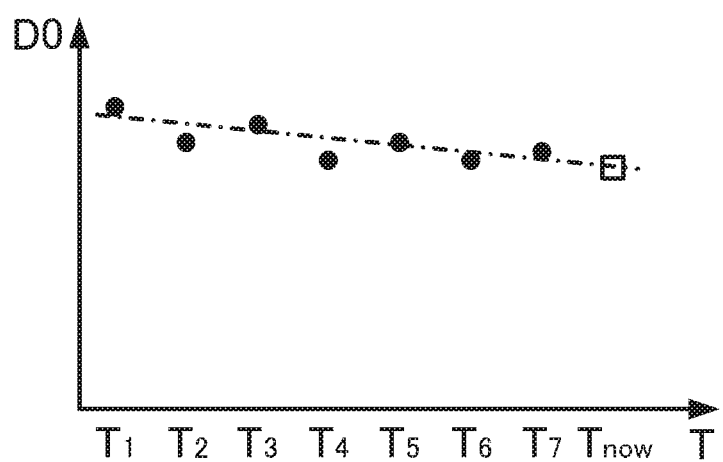
FIG. 15 is a diagram for explaining a calculation method of an initial value D1 and an amount of change ΔD.

Next, a calculation method of the initial value D1 and the amount of change ΔD in step S202 will be described. FIG. 15 is a diagram for explaining the calculation method of the initial value D1 and the amount of change ΔD.

The calculation method of the initial value D1 and the amount of change ΔD is similar to the calculation method of the initial value H1 and the amount of change ΔH described above. Specifically, the control unit 40 obtains the initial value D1 and the amount of change ΔD based on previous setting values of the multi-stage deflector 22 which are stored in the storage unit 50.

For example, the control unit 40 causes the storage unit 50 to store the setting value D0 of the multi-stage deflector 22 at set time intervals as illustrated in FIG. 15. In addition, the control unit 40 causes the storage unit 50 to store, together with the setting value D0, a time point at which the setting value D0 had been stored.

The control unit 40 reads the setting values D0 stored in the storage unit 50, calculates a time average DT of the setting values D0, and adopts the calculated time average DT as the initial value D1. In other words, D1=DT. In this manner, the setting value D0 at a present time point Tnow is estimated from previous setting values D0 to determine the initial value D1. In addition, for example, the control unit 40 calculates a standard deviation σ of the setting values D0 and adopts the calculated standard deviation σ as the amount of change ΔD. In other words, ΔD=σ. In this manner, a variation in the setting value D0 is estimated from a variation in previous setting values D0 to determine the amount of change ΔD.

2.2.3. Calculation Method of Setting Value D0

Next, a calculation method of the setting value D0 in step S222 will be described.

The calculation method of the setting value D0 is similar to the calculation method of the setting value H0 described above. Specifically, taking advantage of the fact that the setting value D1, the setting value D2, and the setting value D3 and the first amount of change ΔP1, the second amount of change ΔP2, and the third amount of change ΔP3 are in a linear relationship, a relational expression is obtained from these values. In addition, from the relational expression, the setting value D0 of the multi-stage deflector 22 is obtained at which the amount of change ΔP becomes zero when the setting value of the illumination lens system 24 is changed.

For example, first, a1, a2, b1, and b2 expressed by the following equations are obtained.

$$a1 = (\Delta P2 - \Delta P1)/(D2 - D1)$$

$$a2 = (\Delta P3 - \Delta P2)/(D3 - D2)$$

$$b1 = (D2 \times \Delta P1 - D1 \times \Delta P2)/(D2 - D1)$$

$$b2 = (D3 \times \Delta P2 - D2 \times \Delta P3)/(D3 - D2)$$

In this case, when a1=a2, the setting value D0 is obtained by the following equation.

$$D0 = |b1/a1|$$

In addition, when |a1|>|a2|, the setting value D0 is obtained by the following equation.

$$D0 = |b1/a1|$$

Furthermore, when |a1|<|a2|, the setting value D0 is obtained by the following equation.

$$D0 = |b2/a2|$$

2.3. Effects

For example, the electron microscope 100 according to the second embodiment has the following effects.

With the electron microscope according to the second embodiment, since the control unit 40 obtains the initial value D1 and the amount of change ΔD in the optimization processing of an incidence angle based on previous setting values of the multi-stage deflector 22, an adjustment of the multi-stage deflector 22 can be accurately performed within a short period of time.

3. Third Embodiment

3.1 Electron Microscope

Figure 16:
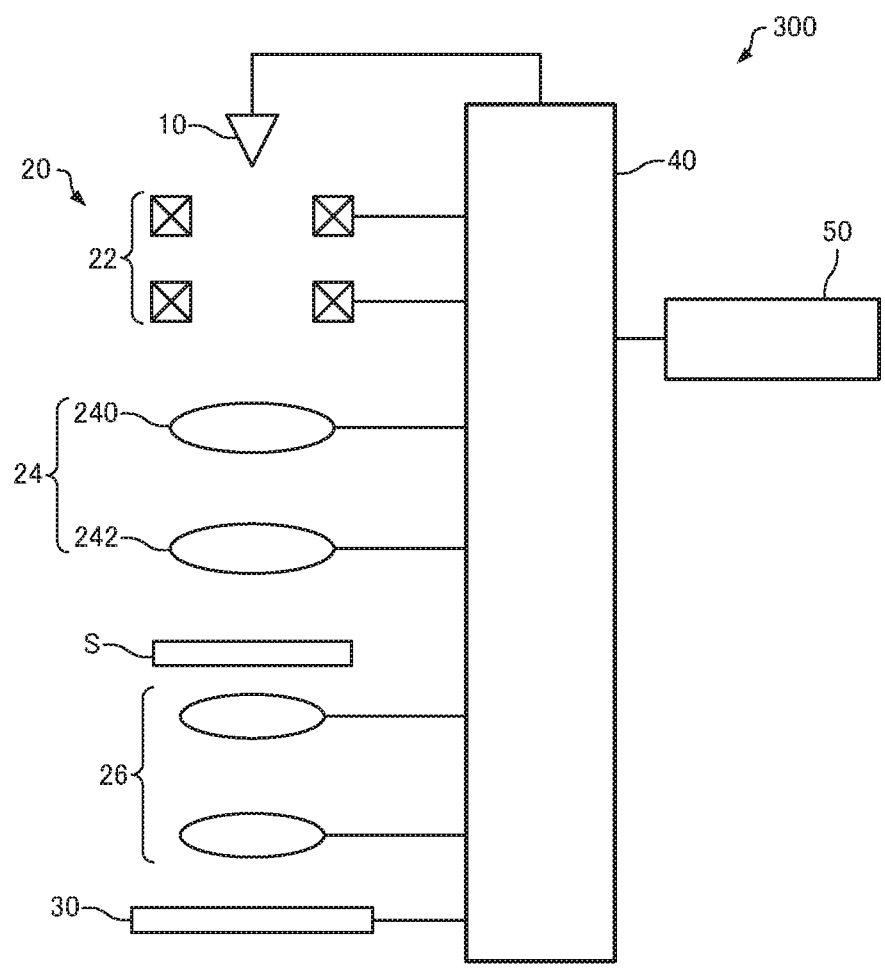
FIG. 16 is a diagram illustrating a configuration of an electron microscope according to a third embodiment.

Next, an electron microscope according to a third embodiment will be described with reference to the drawings. FIG. 16 is a diagram illustrating a configuration of an electron microscope 300 according to the third embodiment. Hereinafter, in the electron microscope 300 according to the third embodiment, members having similar functions to the components of the electron microscope 100 according to the first embodiment will be denoted by same reference characters and a detailed description thereof will be omitted.

In the electron microscope 300, the illumination lens system 24 has a dose adjustment lens 240 and an illumination lens 242. It should be noted that the illumination lens 242 is an example of the first optical element and the dose adjustment lens 240 is an example of the second optical element.

The dose adjustment lens 240 is a lens for controlling a dose of an electron beam with respect to the specimen S by controlling an illumination angle of the electron beam or, in other words, a divergence angle of the electron beam. The illumination lens 242 is a lens for illuminating the specimen S with the electron beam. For example, the illumination lens 242 is arranged to the rear of the dose adjustment lens 240. In the illustrated example, the illumination lens 242 is arranged directly above the specimen S.

For example, the dose adjustment lens 240 is used to parallelly illuminate the specimen S with the electron beam. In other words, with the electron microscope 300, Koehler illumination can be realized by the dose adjustment lens 240.

3.2. Control Method of Optical System

Next, a control method of an optical system of an electron microscope according to the third embodiment will be described. The following description will focus on points that differ from the example of the control method of the optical system of the electron microscope according to the first embodiment described above, and a description of similar points will be omitted.

3.2.1. Optimization Process of Illumination Angle

In the electron microscope 300, the optical system 20 is controlled by the control unit 40. Hereinafter, processing will be described in which the control unit 40 controls the dose adjustment lens 240 so that an illumination angle of an electron beam which illuminates the specimen S assumes an optimal angle. Hereinafter, this processing will also be referred to as optimization processing of an illumination angle.

The optimal illumination angle can be set to an arbitrary angle. Hereinafter, a case will be described in which the dose adjustment lens 240 is adjusted so that an electron beam parallelly illuminates the specimen S.

Figure 17:
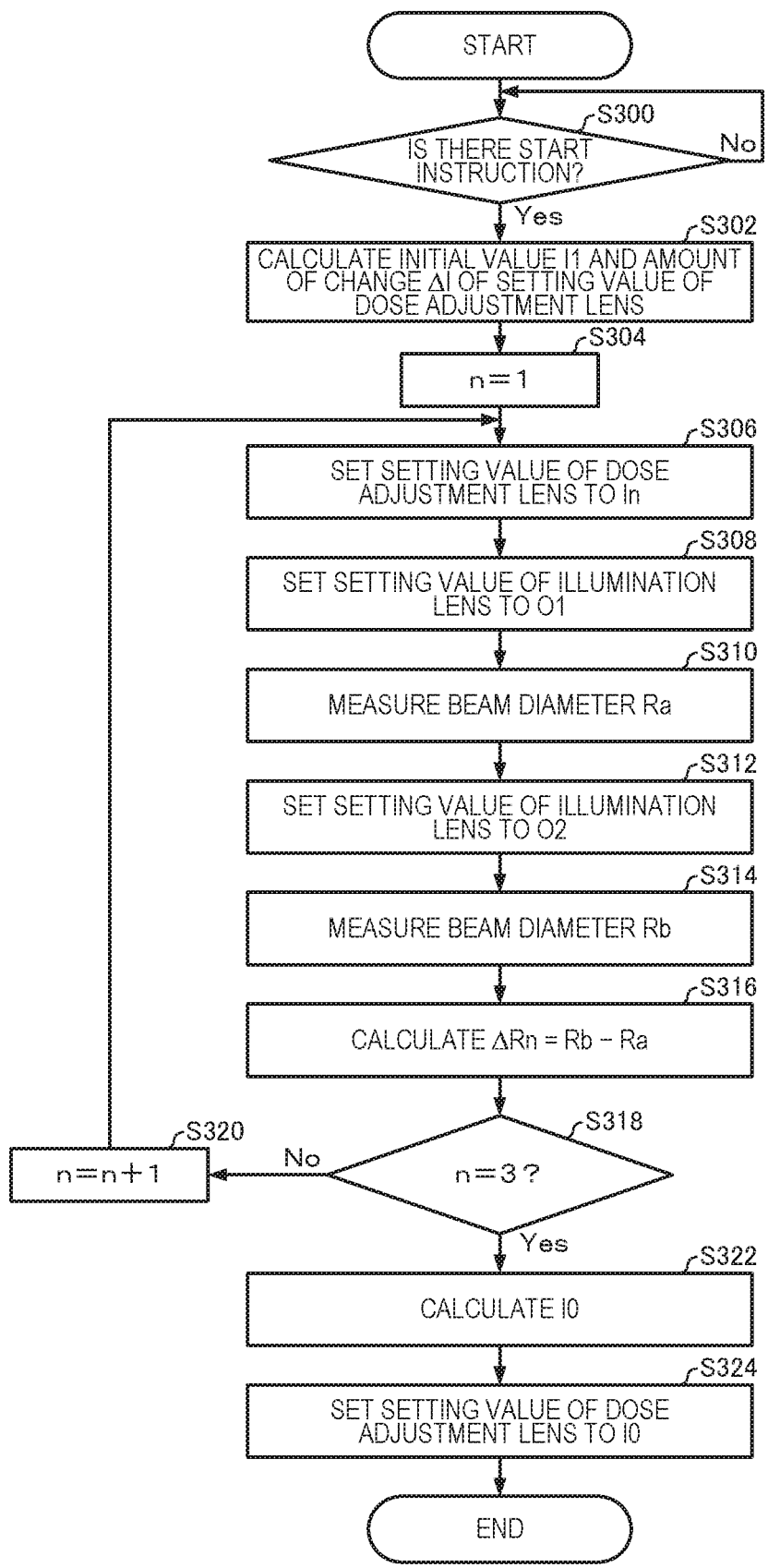
FIG. 17 is a flow chart illustrating an example of optimization processing of an illumination angle.
Figure 18:
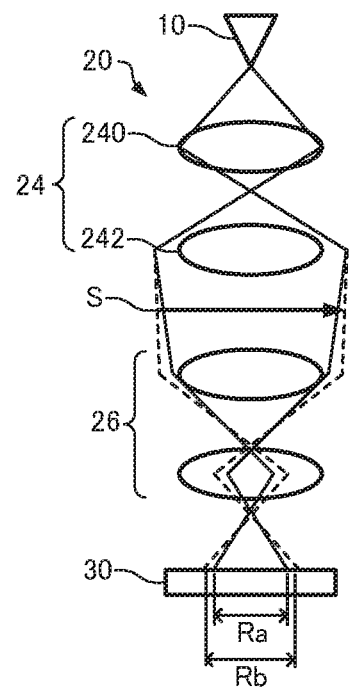
FIG. 18 is a diagram for explaining an operation of an optical system during optimization processing of an illumination angle.
Figure 19:
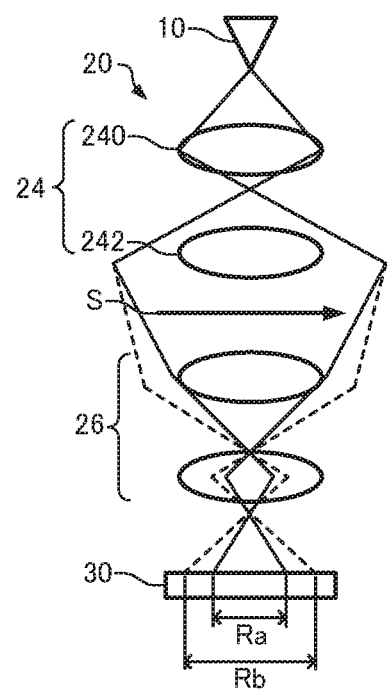
FIG. 19 is a diagram for explaining an operation of an optical system during optimization processing of an illumination angle.
Figure 20:
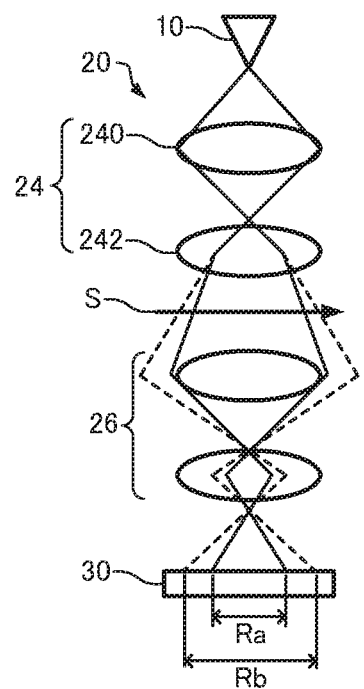
FIG. 20 is a diagram for explaining an operation of an optical system during optimization processing of an illumination angle.

FIG. 17 is a flow chart illustrating an example of the optimization processing of an illumination angle. FIGS. 18 to 20 are diagrams for explaining an operation of the optical system 20 during the optimization processing of an illumination angle. It should be noted that, in FIGS. 18 to 20, only the electron source 10, the dose adjustment lens 240, the illumination lens 242, the imaging lens system 26, and the detector 30 are illustrated for the sake of brevity.

The control unit 40 determines whether or not the user has issued an instruction to start the optimization processing of an illumination angle (S300).

When it is determined that a start instruction has been issued (Yes in S300), the control unit 40 calculates an initial value I1 of a setting value In of the dose adjustment lens 240 and an amount of change ΔI of the setting value In of the dose adjustment lens 240 (S302). The setting value In of the dose adjustment lens 240 is a value that controls an illumination angle of an electron beam. A calculation method of the initial value I1 and the amount of change ΔI will be described later.

Next, the control unit 40 sets the setting value of the dose adjustment lens 240 to the initial value I1 and obtains a first amount of change ΔR1 which is an amount of change of a beam diameter of the electron beam having passed through the illumination lens 242 when the setting value of the illumination lens 242 is changed (S306 to S316).

Specifically, first, assuming that n=1 is true (S304), the control unit 40 sets the setting value of the dose adjustment lens 240 to the initial value I1 (S306). As the initial value I1, the value calculated in the processing of step S302 is used.

Next, the control unit 40 sets the setting value of the illumination lens 242 to a setting value O1 (S308). The setting value O1 can be set to an arbitrary value. In a state where the setting value of the dose adjustment lens 240 is set to the initial value I1 and the setting value of the illumination lens 242 is set to the setting value O1, the control unit 40 measures a beam diameter Ra of the electron beam on the detector 30 as illustrated in FIG. 18 (S310). For example, the control unit 40 acquires a TEM image photographed by the detector 30 and measures the beam diameter Ra from the acquired TEM image.

Next, the control unit 40 sets the setting value of the illumination lens 242 to a setting value O2 (S312). The setting value O2 is expressed as O2=O1+ΔO. The amount of change ΔO can be set to an arbitrary value. The setting value O2 is set to a value that differs from the setting value O1. In a state where the setting value of the dose adjustment lens 240 is set to the initial value I1 and the setting value of the illumination lens 242 is set to the setting value O2, the control unit 40 measures a beam diameter Rb of the electron beam on the detector 30 as illustrated in FIG. 18 (S314). For example, the control unit 40 acquires a TEM image photographed by the detector 30 and measures the beam diameter Rb from the acquired TEM image.

Next, the control unit 40 calculates a first amount of change ΔR1=Rb−Ra (S316). According to the steps described above, the first amount of change ΔR1 can be obtained.

Next, the control unit 40 determines whether or not n=3 is true (S318), and when it is determined that n=3 is false (No in S318), the control unit 40 assumes that n=n+1 is true (S320) and returns to step S306. In addition, the control unit 40 sets the setting value of the dose adjustment lens 240 to a setting value I2 which represents a change by the amount of change ΔI from the initial value I1 and obtains a second amount of change ΔR2 which is an amount of change of the beam diameter of the electron beam having passed through the illumination lens 242 when the setting value of the illumination lens 242 is changed (S306 to S316).

Specifically, first, the control unit 40 sets the setting value of the dose adjustment lens 240 to the setting value I2 (S306). The setting value I2 is a value as a result of changing the initial value I1 by the amount of change ΔI obtained in step S302. For example, I2=I1+ΔI. By having the control unit 40 change the setting value of the dose adjustment lens 240 from the setting value I1 to the setting value I2, the illumination angle of the electron beam changes.

Next, the control unit 40 sets the setting value of the illumination lens 242 to the setting value O1 (S308). In a state where the setting value of the dose adjustment lens 240 is set to the setting value I2 and the setting value of the illumination lens 242 is set to the setting value O1, the control unit 40 measures the beam diameter Ra of the electron beam on the detector 30 as illustrated in FIG. 19 (S310).

Next, the control unit 40 sets the setting value of the illumination lens 242 to the setting value O2 (S312). In a state where the setting value of the dose adjustment lens 240 is set to the setting value I2 and the setting value of the illumination lens 242 is set to the setting value O2, the control unit 40 measures the beam diameter Rb of the electron beam on the detector 30 as illustrated in FIG. 19 (S314).

Next, the control unit 40 calculates a second amount of change ΔR2=Rb−Ra (S316). According to the steps described above, the second amount of change ΔR2 can be obtained.

Next, the control unit 40 determines whether or not n=3 is true (S318), and when it is determined that n=3 is false (No in S318), the control unit 40 assumes that n=n+1 is true (S320) and returns to step S306. In addition, the control unit 40 sets the setting value of the dose adjustment lens 240 to a setting value I3 which represents a change by an amount of change ΔI from the initial value I1 and obtains a third amount of change ΔR3 which is an amount of change of the beam diameter of the electron beam having passed through the illumination lens 242 when the setting value of the illumination lens 242 is changed (S306 to S316).

Specifically, first, the control unit 40 sets the setting value of the dose adjustment lens 240 to the setting value I3 (S306). The setting value I3 is a value as a result of changing the initial value I1 by the amount of change ΔI obtained in step S302. For example, I3=I1−ΔI. By having the control unit 40 change the setting value of the dose adjustment lens 240 from the setting value I2 to the setting value I3, the illumination angle of the electron beam changes.

Next, the control unit 40 sets the setting value of the illumination lens 242 to the setting value O1 (S308). In a state where the setting value of the dose adjustment lens 240 is set to the setting value I3 and the setting value of the illumination lens 242 is set to the setting value O1, the control unit 40 measures the beam diameter Ra of the electron beam on the detector 30 as illustrated in FIG. 20 (S310).

Next, the control unit 40 sets the setting value of the illumination lens 242 to the setting value O2 (S312). In a state where the setting value of the dose adjustment lens 240 is set to the setting value I3 and the setting value of the illumination lens 242 is set to the setting value O2, the control unit 40 measures the beam diameter Rb of the electron beam on the detector 30 as illustrated in FIG. 20 (S314).

Next, the control unit 40 calculates a third amount of change ΔR3=Rb−Ra (S316). According to the steps described above, the third amount of change ΔR3 can be obtained.

The control unit 40 determines whether or not n=3 is true (S318), and when it is determined that n=3 is true (Yes in S318), the control unit 40 obtains a setting value I0 of the dose adjustment lens 240 at which an amount of change of the beam diameter of the electron beam having passed through the illumination lens 242 becomes zero when the setting value of the illumination lens 242 is changed based on the first amount of change ΔR1, the second amount of change ΔR2, and the third amount of change ΔR3 (S322). A calculation method of the setting value I0 will be described later.

The control unit 40 sets the setting value of the dose adjustment lens 240 to the setting value I0 determined in step S322 (S324). Subsequently, the control unit 40 ends the processing.

3.2.2. Calculation of Initial Value I1 and Amount of Change ΔI

Figure 21:
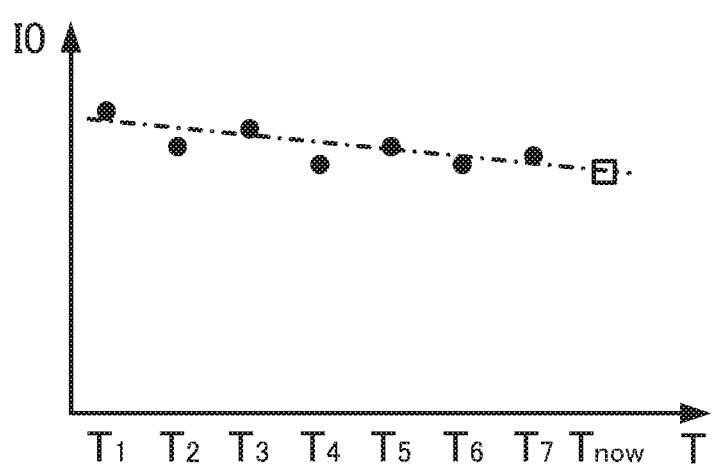
FIG. 21 is a diagram for explaining a calculation method of an initial value I1 and an amount of change ΔI.

Next, a calculation method of the initial value I1 and the amount of change ΔI in step S302 will be described. FIG. 21 is a diagram for explaining the calculation method of the initial value I1 and the amount of change ΔI.

The calculation method of the initial value I1 and the amount of change ΔI is similar to the calculation method of the initial value H1 and the amount of change ΔH described above. Specifically, the control unit 40 obtains the initial value I1 and the amount of change ΔI based on previous setting values of the dose adjustment lens 240 which are stored in the storage unit 50.

The control unit 40 causes the storage unit 50 to store a setting value of the dose adjustment lens 240 at set time intervals. In addition, the control unit 40 causes the storage unit 50 to store, together with the setting value I0, a time point at which the setting value I0 had been stored.

For example, the control unit 40 reads the setting values I0 stored in the storage unit 50, calculates a time average IT of the setting value I0, and adopts the calculated time average IT as the initial value I1. In other words, I1=IT. In this manner, the setting value I0 at a present time point Tnow is estimated from previous setting values I0 to determine the initial value I1. In addition, for example, the control unit 40 calculates a standard deviation σ of the setting values I0 and adopts the calculated standard deviation σ as the amount of change ΔI. In other words, ΔI=σ. In this manner, a variation in the setting value I0 is estimated from a variation in previous setting values I0 to determine the amount of change ΔI.

3.2.3. Calculation Method of Setting Value I0

Next, a calculation method of the setting value I0 in step S322 will be described.

Figure 22:
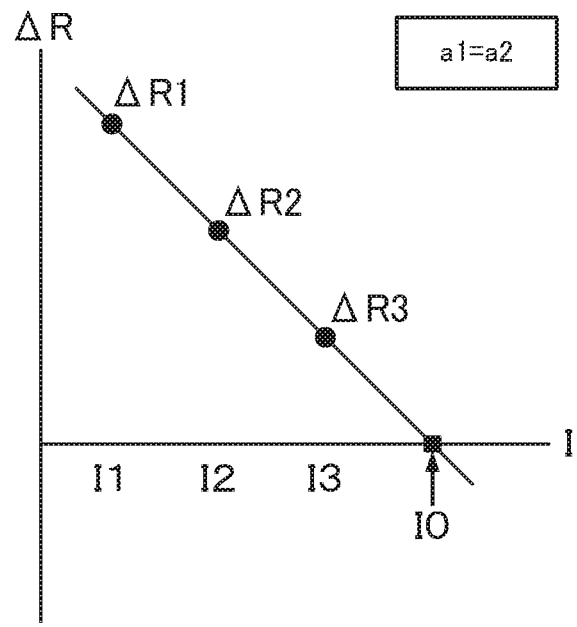
FIG. 22 is a diagram for explaining a calculation method of a setting value I0.
Figure 23:
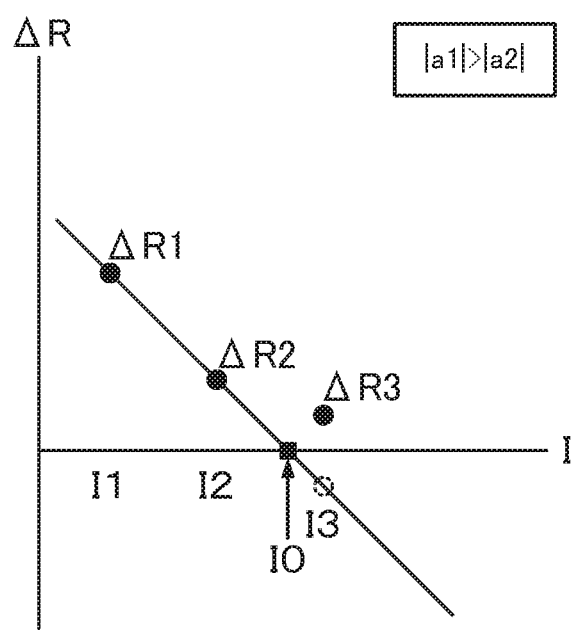
FIG. 23 is a diagram for explaining a calculation method of the setting value I0.
Figure 24:
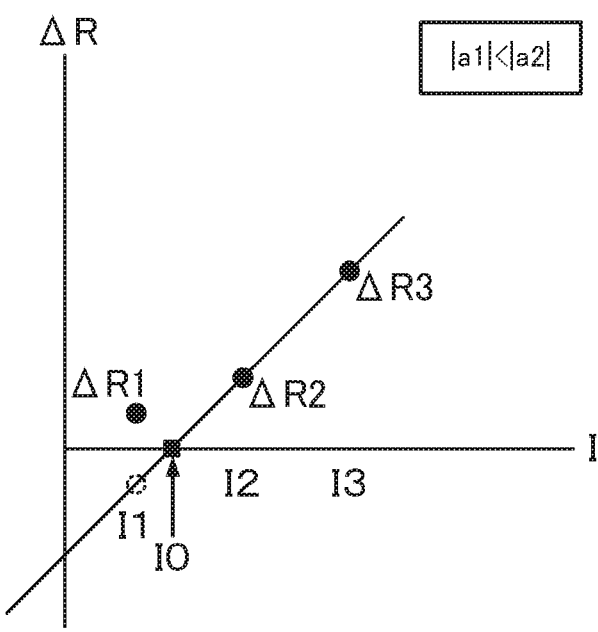
FIG. 24 is a diagram for explaining a calculation method of the setting value I0.

FIGS. 22 to 24 are diagrams for explaining a calculation method of the setting value I0.

The setting value I1, the setting value I2, and the setting value I3 and the first amount of change ΔR1, the second amount of change ΔR2, and the third amount of change ΔR3 are in a linear relationship. Therefore, a relational expression is obtained from these values to obtain the setting value I0 of the dose adjustment lens 240 at which the amount of change ΔR of the beam diameter of an electron beam having passed through the illumination lens 242 becomes zero when the setting value of the illumination lens 242 is changed.

For example, first, a1, a2, b1, and b2 expressed by the following equations are obtained.

$$a1=(\Delta R2-\Delta R1)/(I2-I1)$$

$$a2=(\Delta R3-\Delta R2)/(I3-I2)$$

$$b1=(I2\times\Delta R1-I1\times\Delta R2)/(I2-I1)$$

$$b2=(I3\times\Delta R2-I2\times\Delta R3)/(I3-I2)$$

In this case, as illustrated in FIG. 22, when a1=a2, the setting value I0 is obtained by the following equation.

$$I0=|b1/a1|$$

In addition, as illustrated in FIG. 23, when |a1|>|a2|, the setting value I0 is obtained by the following equation.

$$I0=|b1/a1|$$

In addition, as illustrated in FIG. 24, when |a1|<|a2|, the setting value I0 is obtained by the following equation.

$$I0=|b2/a2|$$

It should be noted that the calculation method of the setting value I0 is not limited to the example described above. For example, while the setting value of the dose adjustment lens 240 is changed such that I1, I2=I1+ΔI, and I3=I1−ΔI1 in the example described above, the setting value of the dose adjustment lens 240 may be changed such that I1, I2=I1+ΔI, and I3=I1+2×ΔI. Alternatively, for example, the setting value of the dose adjustment lens 240 may be changed such that I1, I2=I1−ΔI, and I3=I1−2×ΔI.

3.3. Effects

For example, the electron microscope 300 has the following effects.

With the electron microscope 300, since the control unit 40 obtains the initial value I1 and the amount of change ΔI in the optimization processing of an illumination angle based on previous setting values of the dose adjustment lens 240, an adjustment of the dose adjustment lens 240 can be accurately performed within a short period of time.

3.4. Modifications

While a case in which the dose adjustment lens 240 is adjusted so that an electron beam parallelly illuminates the specimen S as optimization processing of an illumination angle has been explained in the example described above, the illumination angle can also be set to an arbitrary angle in the optimization processing of an illumination angle. As described above, the setting value I1, the setting value I2, and the setting value I3 and the first amount of change ΔR1, the second amount of change ΔR2, and the third amount of change ΔR3 are in a linear relationship. Therefore by obtaining a relationship between the amount of change ΔR and the illumination angle in advance, the dose adjustment lens 240 can also be adjusted so as to realize a desired illumination angle in the optimization processing of an illumination angle.

It should be noted that the embodiments and the modifications described above are merely examples and the invention is not limited thereto. For example, the respective embodiments and the respective modifications may be combined as deemed appropriate.

The invention is not limited to the embodiments described above and various modifications can be further made. For example, the invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam device comprising:
   a charged particle source;
   an optical system which acts on a charged particle beam emitted from the charged particle source;
   a control unit which controls the optical system; and
   a storage unit which stores previous setting values of the optical system,
   the optical system including:
      a first optical element; and
      a second optical element for controlling a state of the charged particle beam to be incident on the first optical element,
   the control unit programmed or configured to:
      obtain an initial value of a setting value of the second optical element based on previous setting values of the second optical element which are stored in the storage unit;

change a state of the charged particle beam by changing the setting value of the second optical element from the obtained initial value;

obtain the setting value of the second optical element based on the change in the state of the charged particle beam; and cause the storage unit to store the setting value of the second optical element at predetermined time intervals.

2. The charged particle beam device according to claim 1, wherein the initial value is a time average of the previous setting values of the second optical element which are stored in the storage unit.

3. The charged particle beam device according to claim 1, wherein the control unit is programmed or configured to:

obtain an amount of change of the setting value of the second optical element from the initial value based on the previous setting values of the second optical element which are stored in the storage unit, and wherein, when obtaining the initial value of the setting value of the second optical element, the control unit is programmed or configured to:

change the setting value of the second optical element by the obtained amount of change.

4. The charged particle beam device according to claim 3, wherein the amount of change is a standard deviation of the previous setting values of the second optical element which are stored in the storage unit.

5. The charged particle beam device according to claim 1, wherein after obtaining the setting value of the second optical element, the control unit is programmed or configured to:

cause the storage unit to store the obtained setting value of the second optical element.

6. The charged particle beam device according to claim 1, wherein, when obtaining the initial value of the setting value of the second optical element, the control unit is programmed or configured to:

obtain a first amount of change which is an amount of change of a position of the charged particle beam which has passed through the first optical element when a setting value of the first optical element has been changed by setting the setting value of the second optical element to the initial value, obtain a second amount of change which is an amount of change of the position of the charged particle beam which has passed through the first optical element when the setting value of the first optical element has been changed by changing the setting value of the second optical element from the initial value, and obtain the setting value of the second optical element which makes an amount of change of the position of the charged particle beam which has passed through the first optical element zero when the setting value of the first optical element has been changed based on the first amount of change and the second amount of change.

7. The charged particle beam device according to claim 6, wherein the first optical element is a multi-stage lens system, the second optical element is a multi-stage deflector, and the setting value of the second optical element is a value which controls an incidence position of the charged particle beam with respect to the first optical element.

8. The charged particle beam device according to claim 6, wherein the first optical element is a multi-stage lens system, the second optical element is a multi-stage deflector, and the setting value of the second optical element is a value which controls an incidence angle of the charged particle beam with respect to an optical axis of the first optical element.

9. The charged particle beam device according to claim 1, wherein the first optical element is an illumination lens which illuminates a specimen with the charged particle beam, the second optical element is a dose adjustment lens for adjusting an illumination angle of the charged particle beam, the setting value of the second optical element is a value which controls an illumination angle of the charged particle beam, and wherein, when obtaining the initial value of the setting value of the second optical element, the control unit is programmed or configured to:

obtain a first amount of change which is an amount of change of a beam diameter of the charged particle beam which has passed through the first optical element when a setting value of the first optical element has been changed by setting the setting value of the second optical element to the initial value, obtain a second amount of change which is an amount of change of the beam diameter of the charged particle beam which has passed through the first optical element when the setting value of the first optical element has been changed by changing the setting value of the second optical element from the initial value, and obtain the setting value of the second optical element which makes an amount of change of the beam diameter of the charged particle beam which has passed through the first optical element zero when the setting value of the first optical element has been changed based on the first amount of change and the second amount of change.

10. A control method of a charged particle beam device which comprises: a charged particle source; an optical system which acts on a charged particle beam emitted from the charged particle source; and a storage unit which stores previous setting values of the optical system, the optical system comprising a first optical element and a second optical element for controlling a state of the charged particle beam to be incident on the first optical element, the control method comprising:

obtaining, by a control unit, an initial value of a setting value of the second optical element based on previous setting values of the second optical element which are stored in the storage unit;

changing, by the control unit, a state of the charged particle beam by changing the setting value of the second optical element from the obtained initial value;

obtaining, by the control unit, the setting value of the second optical element based on the change in the state of the charged particle beam; and causing the storage unit to store the setting value of the second optical element at predetermined time intervals.

11. A charged particle beam device comprising:
a charged particle source;
an optical system which acts on a charged particle beam emitted from the charged particle source, the optical system including:
  a first optical element; and
  a second optical element for controlling a state of the charged particle beam to be incident on the first optical element;
a storage unit which stores previous setting values of the optical system;
a control unit which controls the optical system, the control unit programmed or configured to:
  obtain an initial value of a setting value of the second optical element based on previous setting values of the second optical element which are stored in the storage unit,
  change a state of the charged particle beam by changing the setting value of the second optical element from the obtained initial value;
  obtain the setting value of the second optical element based on the change in the state of the charged particle beam; and
  cause the storage unit to store the setting value of the second optical element at predetermined time intervals,
wherein the setting value of the second optical element is a value which controls an incidence angle of the charged particle beam with respect to an optical axis of the first optical element; and
wherein, when obtaining the initial value of the setting value of the second optical element, the control unit is programmed or configured to:
  obtain a first amount of change which is an amount of change of a position of the charged particle beam which has passed through the first optical element when a setting value of the first optical element has been changed by setting the setting value of the second optical element to the initial value,
  obtain a second amount of change which is an amount of change of the position of the charged particle beam which has passed through the first optical element when the setting value of the first optical element has been changed by changing the setting value of the second optical element from the initial value, and
  obtain the setting value of the second optical element which makes an amount of change of the position of the charged particle beam which has passed through the first optical element zero when the setting value of the first optical element has been changed based on the first amount of change and the second amount of change.

* * * * *